United States Patent
Dunbar et al.

(10) Patent No.: US 8,935,952 B2
(45) Date of Patent: Jan. 20, 2015

(54) DYNAMIC RACK CABINET STABILITY TESTING

(75) Inventors: James M. Dunbar, Raleigh, NC (US); Eric A. Stegner, Durham, NC (US); Robert W. Stegner, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 13/535,255

(22) Filed: Jun. 27, 2012

(65) Prior Publication Data

US 2014/0000351 A1    Jan. 2, 2014

(51) Int. Cl.
  *G01M 1/00*    (2006.01)
  *G06G 7/48*    (2006.01)
  *G01M 1/12*    (2006.01)
  *G06F 17/50*    (2006.01)

(52) U.S. Cl.
  CPC ............ *G01M 1/12* (2013.01); *G06F 17/5018* (2013.01)
  USPC ................ 73/65.01; 73/65.07; 73/483; 703/7

(58) Field of Classification Search
  None
  See application file for complete search history.

(56) References Cited

U.S. PATENT DOCUMENTS

| | | | |
|---|---|---|---|
| 3,210,989 A * | 10/1965 | King et al. | ................... 73/65.01 |
| 3,657,963 A | 4/1972 | Miller | |
| 3,913,389 A | 10/1975 | Larson | |
| 4,545,236 A | 10/1985 | Turczyn | |
| 5,483,845 A | 1/1996 | Stein et al. | |
| 5,623,094 A | 4/1997 | Song et al. | |
| 5,644,087 A | 7/1997 | Liu | |
| 6,256,601 B1 | 7/2001 | Wipasuramonton et al. | |
| 6,308,555 B1 | 10/2001 | Liem et al. | |
| 6,374,661 B1 | 4/2002 | Buratynski et al. | |
| 6,665,633 B2 | 12/2003 | Fioravanti et al. | |
| 2004/0051517 A1* | 3/2004 | Holt et al. | ................. 324/158.1 |
| 2011/0208678 A1 | 8/2011 | Bougaev et al. | |

* cited by examiner

*Primary Examiner* — Lisa Caputo
*Assistant Examiner* — Gregory A Royal
(74) *Attorney, Agent, or Firm* — Kunzler Law Group, PC; Damion Josephs

(57) ABSTRACT

An apparatus for stability testing of a wheeled assembly includes a straight fulcrum fixed relative to a horizontal surface. The straight fulcrum includes a straight edge parallel to the horizontal surface and located a first height above the horizontal surface. A first position mechanism includes a first position angle. The first position mechanism and straight edge define the first position angle as an obtuse angle and define a test area. A force mechanism vertically offset from the straight edge. The force mechanism applies a force to the wheeled assembly so when the wheeled assembly is positioned in a first position with one side of the wheeled assembly parallel to the first position angle, the force mechanism pulls the wheeled assembly in a direction toward a second position and the wheeled assembly rotates on a vertical axis. The second position includes a portion of the wheeled assembly contacting the straight edge.

20 Claims, 13 Drawing Sheets

DYNAMIC RACK CABINET STABILITY TESTING

FIELD

The subject matter disclosed herein relates to stability testing and more particularly relates to dynamic stability testing of rack cabinets.

BACKGROUND

Description of the Related Art

Rack cabinets, such as those capable to holding rack-mounted computer equipment, are often taller than they are wide and often are movable with wheels mounted or temporarily attached to the bottom. Often the rack cabinets have a high center of gravity due to a height of the cabinets being more than a width and depth. Rack cabinets are typically filled with expensive equipment. When a rack cabinet with this expensive equipment is moved, a high center of gravity can cause the rack to tip over if force is applied incorrectly or if the rack encounters some obstacle while being moved. If a rack cabinet filled with expensive equipment tips over, the equipment may be damaged or destroyed. Of greater concern is the chance of injury to people moving the rack if the rack should fall on a person.

Current testing methods typically involve either analysis of the rack to determine a center of gravity or a static testing setup that measures center of gravity. Both methods ignore more common scenarios, for example where one wheel hits an object and causes spinning of the rack and tipping.

BRIEF SUMMARY

A testing apparatus is disclosed for testing stability of a wheeled assembly. The wheeled assembly includes a bottom and sides and having three or more wheels attached to the bottom. The wheels, in one embodiment, are positioned to support the wheeled assembly and to allow the wheeled assembly to move when force is applied to the wheeled assembly. The testing apparatus, in one embodiment, includes a horizontal planar element fixed relative to a horizontal surface. The horizontal planar element, in one embodiment, includes a straight edge parallel to the horizontal surface. The straight edge is located a first height above the horizontal surface. The first height sized to stop a wheel of the wheeled assembly and the straight edge is wider than two adjacent wheels of the wheeled assembly. The horizontal planar element, in one embodiment, includes an angled edge at the first height above the horizontal surface. The angled edge is along a first position angle where the angled edge and the straight edge define the first position angle as an obtuse angle and define an assembly test area.

The testing apparatus, in one embodiment, includes a vertical planar element fixed relative to the horizontal surface and extending vertically. The vertical planar element may be perpendicular to the horizontal surface. The vertical planar element, in one embodiment, is parallel to the straight edge and horizontally offset a fixed distance from the straight edge and the assembly test area. The vertical element may be wider than the wheeled assembly and positioned along the straight edge. The testing apparatus includes a force mechanism vertically offset from the straight and angled edges and horizontally offset at least the fixed distance from the straight edge. The force mechanism is configured to apply a force to the wheeled assembly such that when the wheeled assembly is positioned in the assembly test area and in a first position with at least one wheel touching the angled edge, the force mechanism pulls the wheeled assembly through the assembly test area in a direction toward a second position such that the wheeled assembly rotates on a vertical axis. The second position includes at least one wheel of the wheeled assembly contacting the straight edge where the wheel that contacts the straight edge at the second position is not in contact with the straight edge in the first position.

In one embodiment, the force mechanism is attached to the vertical planar element and applies the force to the wheeled assembly through a cable attached to the wheeled assembly. In another embodiment, the vertical offset of the force mechanism from the straight and angled edges is between three and seven feet. In another embodiment, the horizontal planar element includes a recess. The recess is positioned between the straight edge and the angled edge and extends away from the assembly test area such that a wheel of the wheeled assembly located near an intersection of the straight edge and the first position angle when the wheeled assembly is in the first position is able to cross the first position angle while the wheeled assembly moves to the second position.

A second embodiment of a testing apparatus of a wheeled assembly includes a straight fulcrum fixed relative to a horizontal surface. The straight fulcrum includes a straight edge parallel to the horizontal surface. The straight edge is located a first height above the horizontal surface and the first height is sized to stop the wheeled assembly. The second embodiment of testing apparatus, in one embodiment, includes a first position mechanism. The first position mechanism includes a first position angle. The first position mechanism and the straight edge define the first position angle as an obtuse angle and define an assembly test area. The second embodiment of testing apparatus, in another embodiment, includes a force mechanism vertically offset from the straight edge. The force mechanism is configured to apply a force to the wheeled assembly such that when the wheeled assembly is positioned in a first position with one side of the wheeled assembly parallel to the first position angle, the force mechanism pulls the wheeled assembly in a direction toward a second position such that the wheeled assembly rotates on a vertical axis. The second position includes at least one portion of the wheeled assembly contacting the straight edge. The portion of the wheeled assembly contacting the straight edge at the second position is not in contact with the straight edge in the first position.

In one embodiment, the first position mechanism includes an angled fulcrum fixed relative to the horizontal surface. The angled fulcrum includes an angled edge and the angled edge is positioned along the first position angle. The angled edge is at a second height above the horizontal surface. The second height is sized to stop the wheeled assembly. In another embodiment, the first height is the same as the second height. In another embodiment, the straight fulcrum and the angled fulcrum are portions of a horizontal planar element. The horizontal planar element includes a surface parallel to the horizontal surface and at the first height above the horizontal surface.

In one embodiment, the second embodiment of testing apparatus includes a vertical planar element fixed relative to the horizontal surface and extending vertically and perpendicular to the horizontal surface. The vertical planar element may be parallel to the straight edge and is horizontally offset a fixed distance from the straight edge and the assembly test area. In a further embodiment, the force mechanism is horizontally offset from the straight edge a distance that is equal to or greater than the distance the vertical planar element is offset from the straight edge. In another embodiment, the vertical planar element is wider than the wheeled assembly, extends vertically at least a height of the wheeled assembly, and is offset from the straight edge a distance such that the wheeled assembly can tip toward the vertical planar element and off one or more wheels after the wheeled assembly reaches the second position.

In one embodiment, the second embodiment of testing apparatus includes an angled fulcrum recess that extends from the straight edge to the angled fulcrum. The angled fulcrum recess is configured to allow a wheel of the wheeled assembly to move from a position along the first position angle when the wheeled assembly is in the first position to a position across the first position angle and away from the assembly test area during a time when the wheeled assembly is moving from the first position to the second position. In a further embodiment, the wheel that moves across the first position angle is a second wheel and the angled fulcrum recess extends to a location on the angled fulcrum closer to the straight edge than a first wheel of the wheeled assembly that touches the angled fulcrum when the wheeled assembly is in the first position. The first wheel that touches the angled fulcrum is positioned away from the straight edge and the second wheel is located nearer an intersection of the straight edge and the first position angle than other wheels of the wheeled assembly when the wheeled assembly is in the first position.

In one embodiment, the force mechanism applies a constant force to the wheeled assembly for a fixed period of time. In another embodiment, the force mechanism applies the force to the wheeled assembly with a cable extending from the wheeled assembly to the force mechanism. In another embodiment, the force mechanism applies a plurality of forces to the wheeled assembly. The plurality of forces comprises a plurality of stability test conditions. In a further embodiment, the force mechanism applies a first force to the wheeled assembly during a stability test and in each subsequent test applies an increased amount of force and a first test condition where the wheeled assembly tips over defines a tipping point force. In another embodiment, the horizontal surface includes a horizontal planar element extending under the straight fulcrum, the first position mechanism, and the assembly test area. In yet another embodiment, the force mechanism stops applying the force at or before at time when the wheeled assembly reaches the second position.

A third embodiment of a testing apparatus of a wheeled assembly includes a first horizontal planar element with a width and length greater than the wheeled assembly and a vertical planar element perpendicular to the first horizontal planar element. The vertical planar element is attached to an edge of the first horizontal planar element. The vertical planar element includes a width and a height greater than the wheeled assembly. The third embodiment of a testing apparatus includes a second horizontal planar element attached to the vertical planar element and/or to the first horizontal planar element. The second horizontal planar element includes a top that is parallel to the first horizontal planar element. The second planar element includes a straight edge and an angled edge.

The straight edge runs parallel to the vertical planar element and at a height from the first horizontal planar element configured to stop a wheel of the wheeled assembly. The straight edge is offset horizontally from the vertical planar element a distance so that a side of the wheeled assembly does not touch the vertical planar element when at least one wheel of the wheeled assembly is touching the straight edge. The angled edge and the straight edge define a obtuse angle and an assembly test area on the first horizontal planar element. The angled edge matches a height of the straight edge.

The third embodiment of a testing apparatus includes a force mechanism attached to the vertical planar element and vertically offset from the second horizontal element. The force mechanism is configured to apply a force to the wheeled assembly such that when the wheeled assembly is positioned in a first position with at least one wheel touching the angled edge, the force mechanism pulls the wheeled assembly in a direction toward a second position such that the wheeled assembly rotates on a vertical axis. The second position includes at least one portion of the wheeled assembly contacting the straight edge. The portion of the wheeled assembly that contacts the straight edge at the second position is not in contact with the straight edge in the first position.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

The schematic flowchart diagrams and/or schematic block diagrams in the Figures illustrate the architecture, functionality, and operation of possible implementations. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Although various arrow types and line types may be employed in the flowchart and/or block diagrams, they are understood not to limit the scope of the corresponding embodiments. Indeed, some arrows or other connectors may be used to indicate only an exemplary logical flow of the depicted embodiment.

The description of elements in each figure may refer to elements of proceeding figures. Like numbers refer to like elements in all figures, including alternate embodiments of like elements.

Figure 1A:
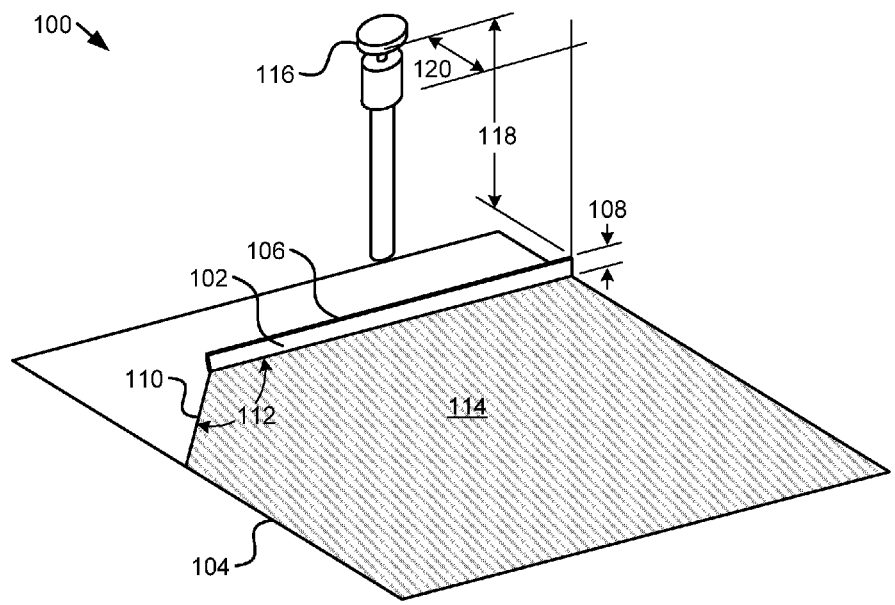
FIG. 1A is a schematic block diagram illustrating a first perspective view of a first embodiment of a testing apparatus in accordance with the present invention.
Figure 1B:
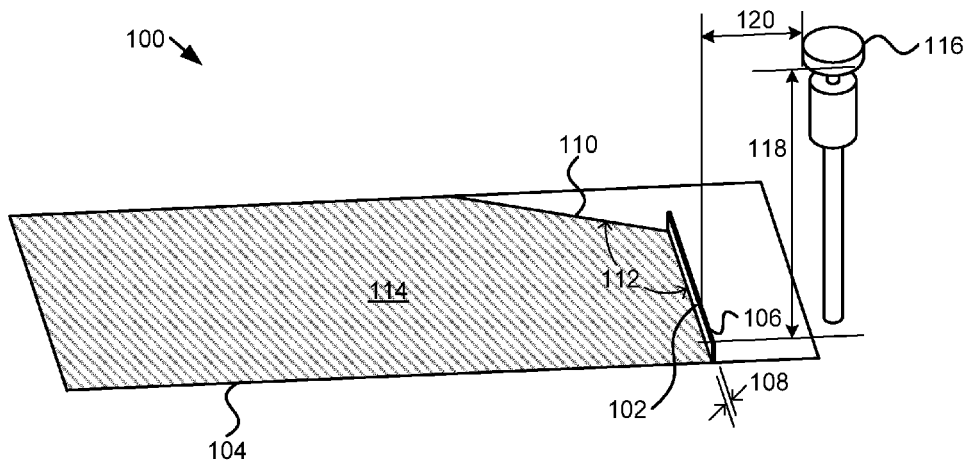
FIG. 1B is a schematic block diagram illustrating a second perspective view of the first embodiment of a testing apparatus in accordance with the present invention.

FIGS. 1A and 1B are schematic block diagrams illustrating a first perspective view and a second perspective view of a first embodiment of a testing apparatus 100 in accordance with the present invention. The testing apparatus 100 aids in stability testing for a wheeled apparatus. The wheeled apparatus typically includes a structure that is movable using wheels attached to the bottom of the structure. The structure typically includes a bottom and sides and a top and is moved by applying a force to a side of the structure. The wheeled assembly in one embodiment includes wheels. Other embodiments are also contemplated with other means for moving the structure such as sliders, castors, wheels that are attached to a dolly and the structure rides on the dolly, or any other assembly that is movable. In some embodiments, the structure of the wheeled assembly is shaped such that the center of gravity of the wheeled assembly is relatively high and/or the wheeled assembly may be tipped over with a combination of applied force and the wheels, sliders, castors, etc. encountering an object, different elevation, etc.

In one embodiment, the wheeled assembly is a rack cabinet. A rack cabinet may include rack-mounted equipment. The rack-mounted equipment may be computer-related equipment, such as blade servers, power supplies, data storage devices, and the like. Often rack cabinets are taller than a width or depth and include wheels or other means to allow the cabinet racks to be moved. Rack-mounted equipment may be expensive which often justifies testing to determine if the rack cabinet with rack-mounted equipment is stable when pushed to be moved. Center of gravity analysis may be inadequate to test rack cabinet stability in certain likely scenarios that arise when moving the rack cabinet. In addition, stability testing may also aid in evaluating safety concerns for personnel moving the rack cabinet. Stability testing for a rack cabinet may also be applicable to other wheeled assemblies, especially for those that may tip easily, include expensive equipment, or may endanger people moving the wheeled assembly. Other wheeled assemblies with various shapes and configurations are also contemplated and may be tested for stability with an embodiment of the invention disclosed herein.

The testing apparatus 100, in one embodiment, includes a straight fulcrum 102 fixed relative to a horizontal surface 104. The straight fulcrum 102 includes a straight edge 106 that is parallel to the horizontal surface 104. The straight edge 106 is located a first height 108 above the horizontal surface 104 and the first height 108 is sized to stop or disrupt movement of a wheeled assembly. For example, the first height 108 may be high enough, relative to a wheel of the wheeled assembly, so that when force is applied to the wheeled assembly that the wheel will stop instead of rolling over the straight fulcrum. In another embodiment, the straight fulcrum 102 is sized to disrupt movement of the wheeled assembly so that an applied force may cause the wheeled assembly to become unstable and tip. The force may be applied to the wheeled assembly, in one embodiment, before the wheel of the wheeled assembly strikes the straight fulcrum 102. In another embodiment, force may be applied to the wheeled assembly while the wheel of the wheeled assembly touches the straight fulcrum 102.

In one embodiment, the first height 108 is at least as high as an axle height or a mid-point of the wheel of the wheeled assembly. In another embodiment, the first height 108 is above a bottom of a structure of the wheeled assembly and a side of the wheeled assembly contacts the straight fulcrum 102. For example, the first height 108 may simulate a height of a curb. A first height 108 above a curb height is also contemplated herein and may be used to simulate the wheeled assembly encountering other, higher objects. A first height 108 that is lower, possibly simulating a bump that might be encountered when moving a wheeled assembly, may also be used to test for stability.

The straight fulcrum 102, in one embodiment, is an edge of a horizontal planar element, such as a board. The board may extend a distance behind the straight edge 106, as is shown in FIGS. 5A, 5B, 6A, 6B, and 6C, or may extend only a small distance behind the straight edge 106. For example, the straight fulcrum 102 may include a 2 inch by 2 inch board and the straight edge 106 may be a corner of the board. In another embodiment, the straight fulcrum 102 may be an edge of a metal bar, L-shaped metal bar, square tubular metal, etc. One of skill in the art will recognize other structures and/or materials to be used as a straight fulcrum 102 and that are shaped with a straight edge 106.

The testing apparatus 100, in one embodiment, includes a first position mechanism 110. The first position mechanism includes a first position angle 112 where the first position mechanism 110 and the straight edge 106 define the first position angle 112 as an obtuse angle, and also define an assembly test area 114. The assembly test area 114 is an area where the wheeled assembly is located prior to commencement of a test and on a side of the straight edge 106 opposite where a force is applied to the wheeled assembly. The assembly test area 114 is on a side of the first position mechanism 110 and the straight edge 106 that is within the obtuse angle.

In one embodiment, the testing apparatus 100 includes a force mechanism 116 that is vertically offset from the straight edge 106. The force mechanism 116 is vertically offset by a vertical offset 118. The vertical offset 118 may be any distance from the top of the straight edge 106 to a height above a height of the wheeled assembly. In one embodiment, the vertical offset 118 is between three feet and seven feet. In another embodiment, the vertical offset 118 is a height that a typical person would push or pull on the wheeled assembly 202.

Figure 2A:
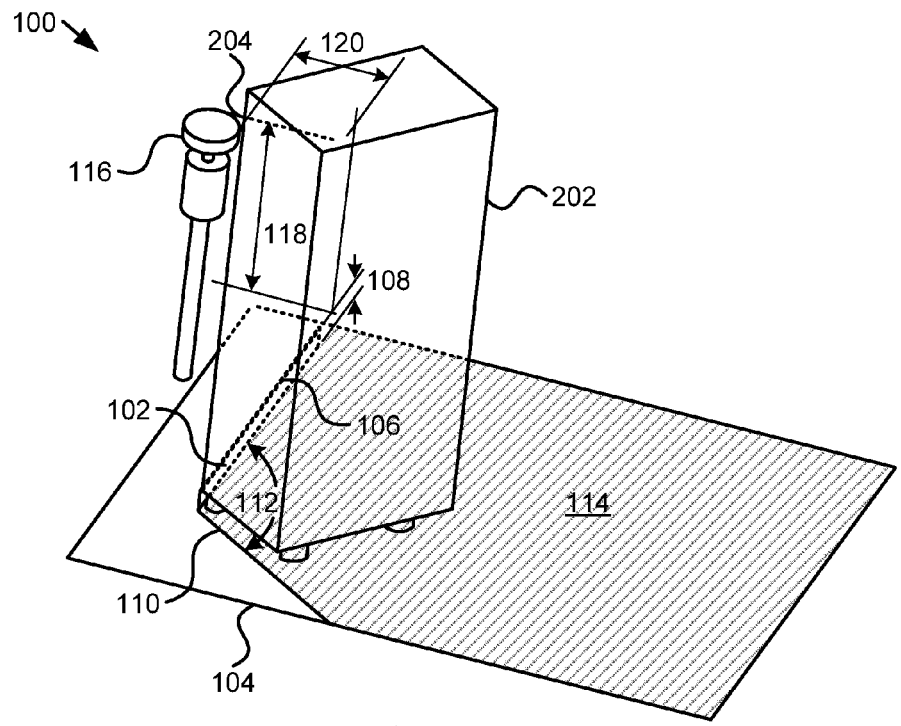
FIG. 2A is a schematic block diagram illustrating a first perspective view of the first embodiment of a testing apparatus with a wheeled assembly in a first position in accordance with the present invention.
Figure 2B:
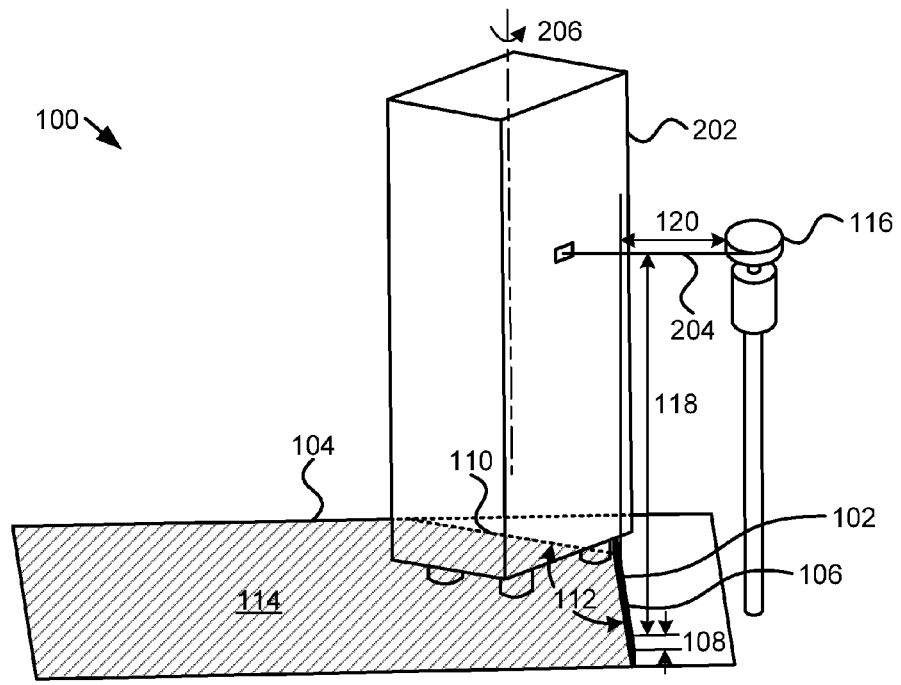
FIG. 2B is a schematic block diagram illustrating a second perspective view of the first embodiment of a testing apparatus with a wheeled assembly in a first position in accordance with the present invention.
Figure 2C:
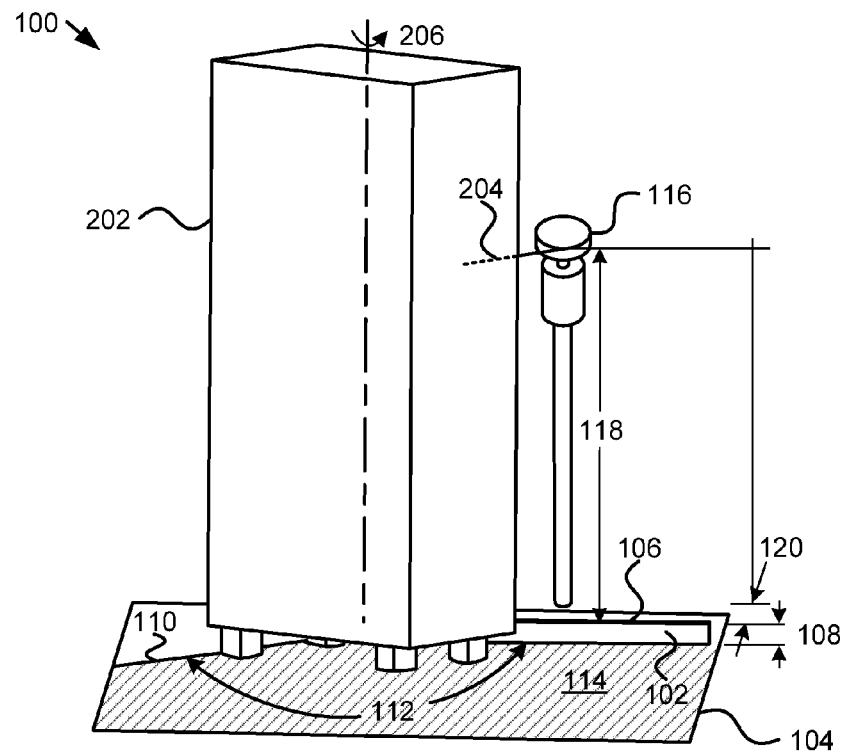
FIG. 2C is a schematic block diagram illustrating a third perspective view of the first embodiment of a testing apparatus with a wheeled assembly in a first position in accordance with the present invention.
Figure 2D:
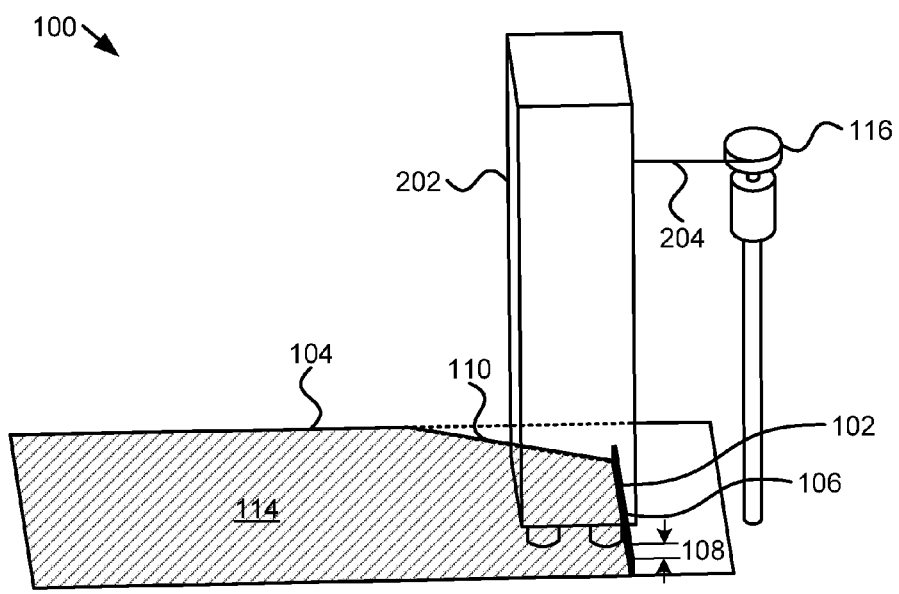
FIG. 2D is a schematic block diagram illustrating a second perspective view of the first embodiment of a testing apparatus with a wheeled assembly in a second position in accordance with the present invention.

FIGS. 2A, 2B, and 2C are schematic block diagrams illustrating a first, a second, and a third perspective view of the first embodiment of the testing apparatus 100 with a wheeled assembly 202 in a first position in accordance with the present invention. FIG. 2D is a schematic block diagram illustrating a second perspective view of the first embodiment of the testing apparatus 100 with a wheeled assembly 202 in a second position in accordance with the present invention. The testing apparatus 100 in FIGS. 2A, 2B, 2C, and 2D (collectively "FIG. 2") is the same as shown in FIGS. 1A and 1B but FIG. 2 includes a wheeled assembly 202. Note that the wheeled assembly 202 has a width and depth that are in a rectangular shape with a height that is greater than the width and depth. The height being greater to the width and depth may contribute to a center of gravity that may be high enough to contribute to instability. The wheeled assembly 202 may be similar to a rack cabinet with computer equipment. Other wheeled assemblies with varying heights, widths, depths, and shapes may be used with the testing apparatus 100 that are different than the wheeled assembly 202 depicted in FIG. 2.

In FIGS. 2A, 2B, and 2C, the wheeled assembly 202 is in a first position where wheeled assembly 202 is aligned with the first position mechanism 110. The wheeled assembly 202 may have a side parallel to the first position mechanism 110. For example, a side of the wheeled assembly 202 may be aligned with the first position mechanism 110. In another example, wheels of the wheeled assembly 202 may be aligned with the first position mechanism 110. The first position mechanism 110 is configured so that the wheeled assembly 202 is angled away from the straight fulcrum 102 when the wheeled assembly 202 is in the first position. The first position, in one embodiment, is a starting position where stability testing of the wheeled assembly 202 begins. As used herein, the wheeled assembly 202 aligned with the first position mechanism 110 includes complete alignment as well as when the wheeled assembly 202 is not completely aligned with the first position mechanism 110 but is aligned to the satisfaction of a person using the testing apparatus 100.

In FIG. 2D, the wheeled assembly 202 is in a second position where the wheeled assembly aligns with the straight edge 106 of the straight fulcrum 102. For example, in the second position, wheels of the wheeled assembly 202 may contact the straight edge 106. In another example, a side of the wheeled assembly 202 may contact the straight edge 106. The second position as depicted in FIG. 2D may be a position along a path of the wheeled assembly 202, but may not be a final position. In one embodiment, when the wheeled assembly 202 is moved from the first position to the second position, the wheeled assembly 202 then reacts to contacting the straight fulcrum 102. As the wheeled assembly 202 reacts to contacting the straight fulcrum 102, the wheeled assembly 202, in some tests, may then tip or tilt past a point where the wheeled assembly would recover back to a standing position and may tip over. In other tests, the wheeled assembly 202 may move from the first position to the second position and may contact the straight fulcrum 102 and may then eventually come to rest in an upright position as depicted. The wheeled assembly 202 may start tipping, may rotate, etc. but may finally end up in an upright position.

The wheeled assembly 202, in the depicted embodiment, is connected to the force mechanism 116 with a connector 204. The force mechanism 116 moves the wheeled assembly 202 from the first position toward the second position. The force mechanism 116 may include a motor, a hydraulic actuator, gears, a pulley system, a lever, or any other mechanism configured to apply a force through a connector 204. The connector 204 may be any device that allows the force mechanism 116 to apply a force to the wheeled assembly 202 to move the wheeled assembly 202. The connector 204, in one embodiment, is a cable, rope, or other flexible material that allows force transfer. In another embodiment, the connector 204 is a metal rod, wooden dowel, or other rigid material that allows force transfer from the force mechanism 116 to the wheeled assembly 202. In the embodiment depicted in FIG. 2, the force mechanism 116 pulls the wheeled assembly 202 in a direction toward a second position such that the wheeled assembly 202 rotates on a vertical axis 206. As used herein, the wheeled assembly 202 rotating on a vertical axis 206 includes the wheeled assembly 202 rotating on a vertical axis 206 as well as an axis that has a vertical component but may not be completely vertical. For example, the wheeled assembly 202 rotating on a vertical axis 206 also includes a wheeled assembly 202 tilting and rotating as force is applied so that the rotation includes a component of rotation around a vertical axis 206 along with a rotational component in another direction.

The force mechanism 116, in one embodiment, moves the wheeled assembly 202 so that at least a portion of the wheeled assembly 202 contacts the straight edge 106 of the straight fulcrum 102 where the portion of the wheeled assembly 202 that contacts the straight edge 106 is a portion that is not in contact with the straight edge 106 in the first position. In one embodiment, the wheeled assembly 202 may be in contact with the straight edge 106 in the first position. For example a wheel of the wheeled assembly 202 may be at the intersection of the straight edge 106 and the first position mechanism 110. Another wheel of the wheeled assembly 202 may then contact the straight edge 106 in the second position, as shown in FIG. 2D. In another embodiment, a side of the wheeled assembly 202 that is angled away from the straight edge 106 in the first position contacts the straight edge 106 in the second position. The side may contact the straight edge 106, for example, where the first height 108 is of a height to be above the bottom of the structure of the wheeled assembly 202.

The force mechanism 116 may be configured to provide a variety of forces on the wheeled assembly 202. For example, the force mechanism 116 may provide a constant force as the wheeled assembly 202 is moving from the first position to the second position. For various tests, the force mechanism 116 may provide a force to the wheeled assembly 202 at various intensities. For example, in a first test, the force mechanism 116 may provide a force that is a lower intensity and then in subsequent tests the intensity level increases for each test. The intensity level of the force applied by the force mechanism 116 may increase to a level where the wheeled assembly 202 tips over, or would tip over if not caught by some mechanism to prevent the wheeled assembly 202 from completely tipping over. The level of intensity of the force may be called a tipping point.

In one embodiment, the force mechanism 116 stops providing force when the wheeled assembly reaches the second position. In another embodiment, the force mechanism 116 continues to provide force to the wheeled assembly 202 after the wheeled assembly 202 reaches the second position. In another embodiment, the force mechanism 116 provides a variable force to the wheeled assembly 202.

In one embodiment, the force mechanism is located a horizontal offset 120 from the straight edge 106. The horizontal offset 120, in one embodiment, may be a distance such that the wheeled assembly 202 may move past the second position to a tipping point without encountering the force mechanism 116. For example, the testing apparatus 100 may be designed to accommodate a variety of wheeled assemblies 202 of various dimensions, each with a different center of gravity, and may include a horizontal offset 120 to accommodate the variety of wheeled assemblies 202.

In one embodiment, the force mechanism 116 applies a force to the wheeled assembly 202 from a direction perpendicular to the straight edge 106. In another embodiment, the force mechanism 116 applies a force to the wheeled assembly 202 from a direction angled away from a line perpendicular to the straight edge 106. In another embodiment, the force mechanism 116 applies a force to the wheeled assembly 202 horizontally. In another embodiment, the force mechanism 116 applies a force to the wheeled assembly 202 with an upward or a downward angle. The force mechanism 116 may provide a force that is a combination of an upward or downward angle and/or at an angle away from a line perpendicular to the straight edge 106. In another embodiment, the vertical offset 118 of the force mechanism 116 is adjustable. In another embodiment, the horizontal offset 120 of the force mechanism 116 is adjustable. In yet another embodiment, the force mechanism 116 may be moved in a direction in line with the straight edge 106. One of skill in the art will recognize other ways to configure the force mechanism 116 to apply a force to the wheeled assembly 202.

Figure 3A:
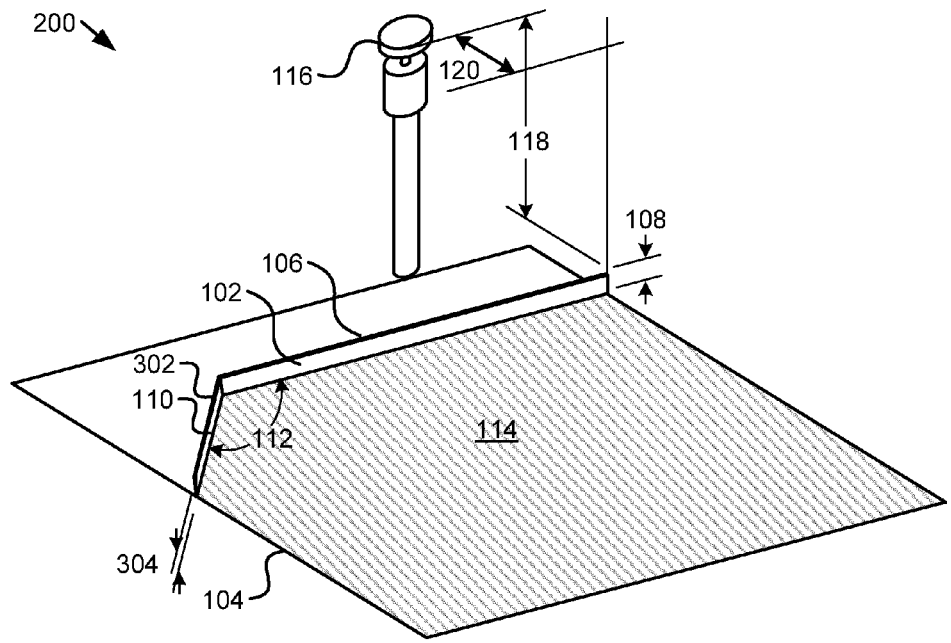
FIG. 3A is a schematic block diagram illustrating a first perspective view of a second embodiment of a testing apparatus in accordance with the present invention.
Figure 3B:
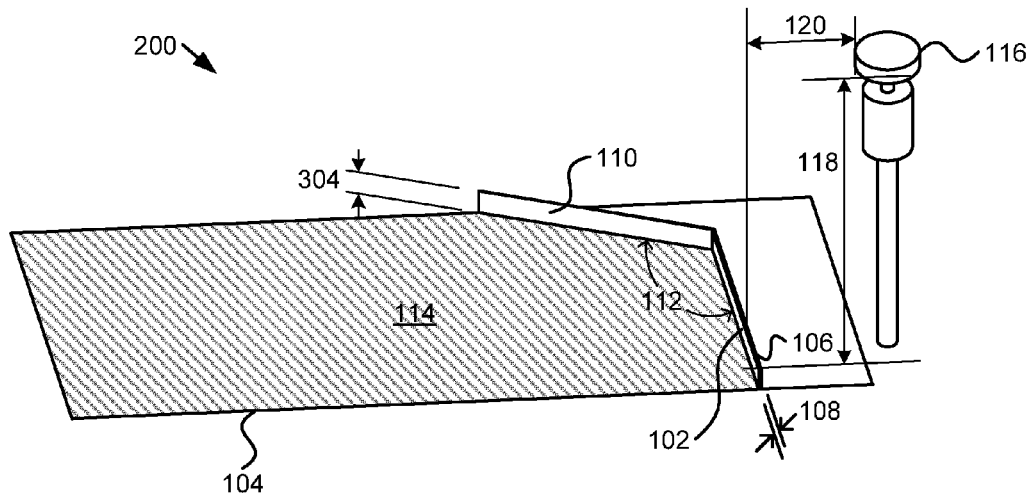
FIG. 3B is a schematic block diagram illustrating a second perspective view of the second embodiment of a testing apparatus in accordance with the present invention.
Figure 4A:
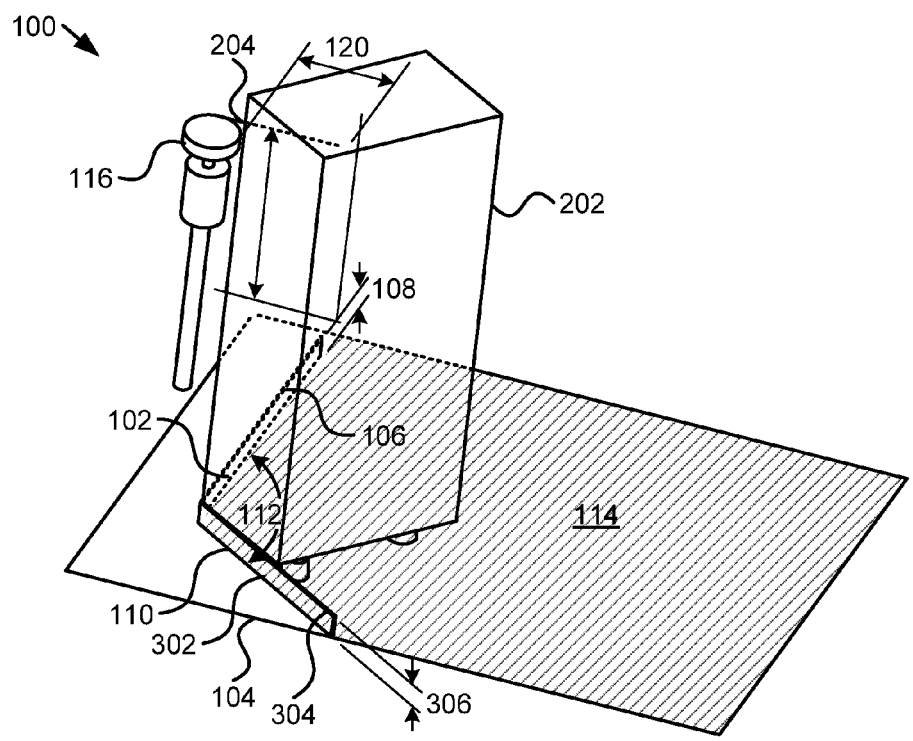
FIG. 4A is a schematic block diagram illustrating a first perspective view of the second embodiment of a testing apparatus with a wheeled assembly in a first position accordance with the present invention.
Figure 4B:
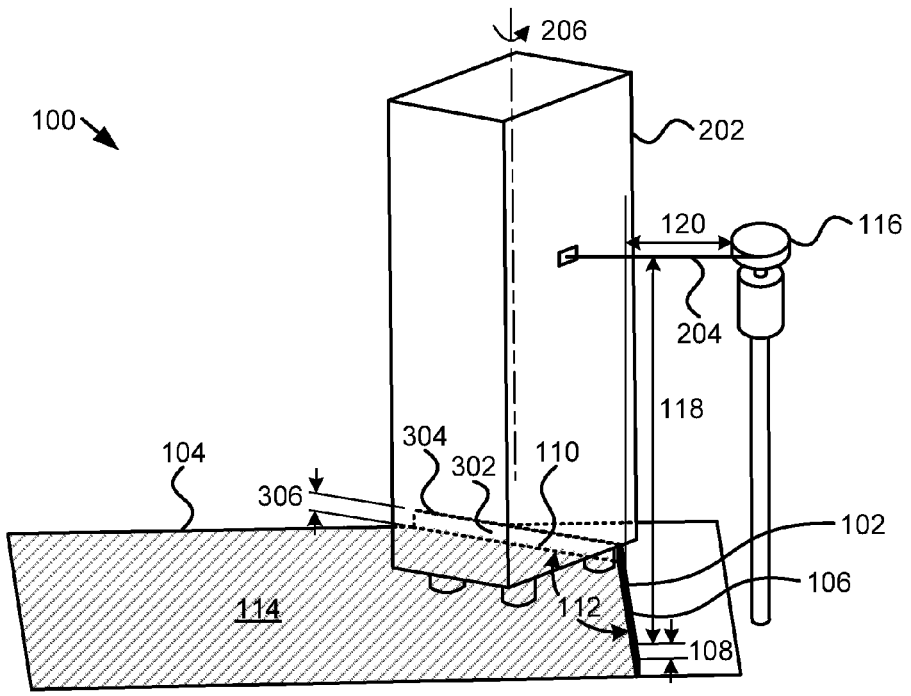
FIG. 4B is a schematic block diagram illustrating a second perspective view of the second embodiment of a testing apparatus with a wheeled assembly in a first position in accordance with the present invention.
Figure 4C:
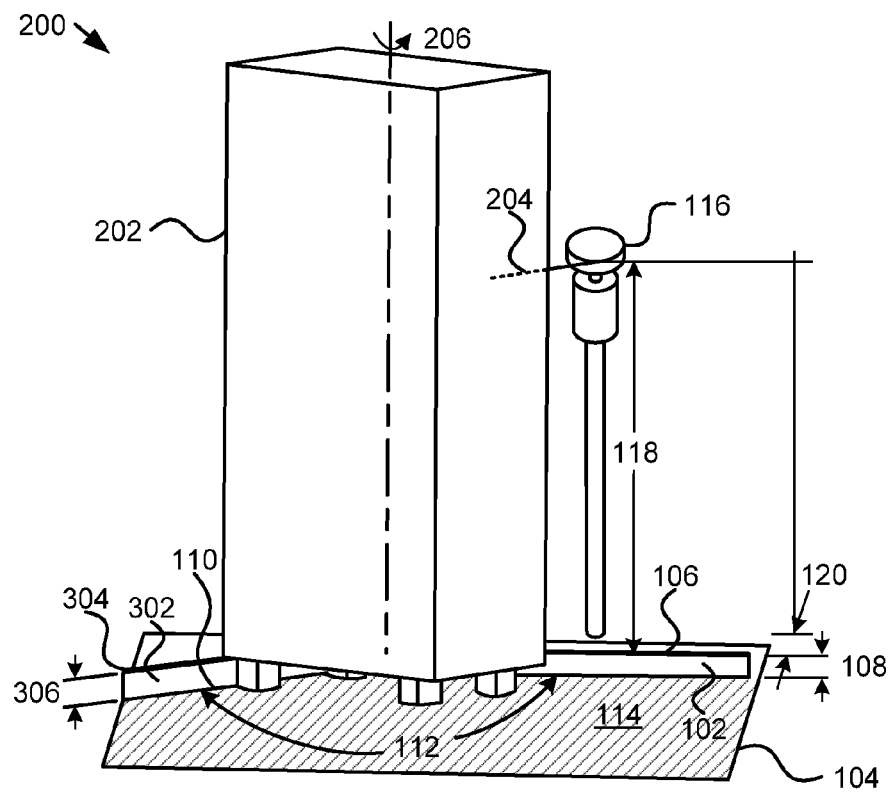
FIG. 4C is a schematic block diagram illustrating a third perspective view of the second embodiment of a testing apparatus with a wheeled assembly in a first position in accordance with the present invention.
Figure 4D:
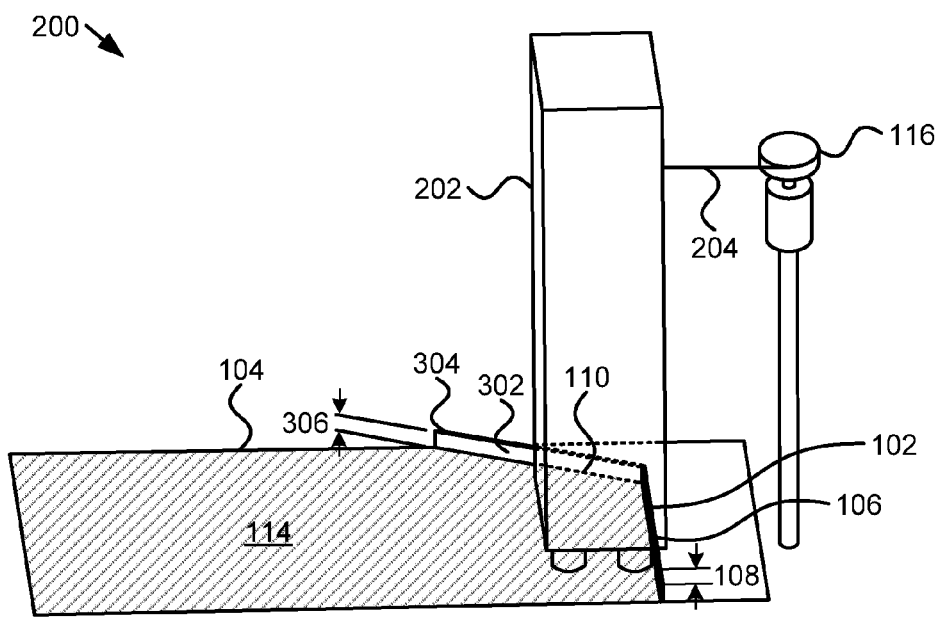
FIG. 4D is a schematic block diagram illustrating a second perspective view of the second embodiment of a testing apparatus with a wheeled assembly in a second position in accordance with the present invention.

FIGS. 3A and 3B are schematic block diagrams illustrating a first and a second perspective view of a second embodiment of a testing apparatus 200 in accordance with the present invention. FIGS. 4A, 4B, and 4C are schematic block diagrams illustrating a first, a second, and a third perspective view of the second embodiment of a testing apparatus with a wheeled assembly in a first position accordance with the present invention. FIG. 4D is a schematic block diagram illustrating a second perspective view of the second embodiment of a testing apparatus 200 with a wheeled assembly in a second position in accordance with the present invention. The testing apparatus 200 includes a straight fulcrum 102, a horizontal surface 104, a straight edge 106, a first height 108, a first position mechanism 110, a first position angle 112, an assembly test area 114, a force mechanism 116, a vertical offset 118, and a horizontal offset 120 which are substantially similar to the testing apparatus 100 of the first embodiment in FIGS. 1A, 1B, 2A, 2B, 2C, and 2D.

The testing apparatus 200 also includes a first position mechanism 110, where the first position mechanism 110 includes an angled fulcrum 302 with an angled edge 304 located a second height 306 above the horizontal surface 104. For the testing apparatus 200, the first position mechanism 110 is in a form similar to the straight fulcrum 102 where the first position mechanism 110 includes an angled fulcrum 302 with an angled edge 304 that is a second height 306 above the horizontal surface 104. In one embodiment, the first height 108 is equal to the second height 306. In another embodiment, the first height 108 differs from the second height 306. The testing apparatus 200 allows the wheeled assembly 202 to be placed against the angled edge 304 as a starting point in the first position. The angled fulcrum 302 may also provide a leverage point so that the wheeled assembly 202 pivots around the vertical axis 206 when the force mechanism 116 applies force. One of skill in the art will recognize other ways that a testing apparatus 200 with an angled fulcrum 302 with an angled edge 304 may be used.

Figure 5A:
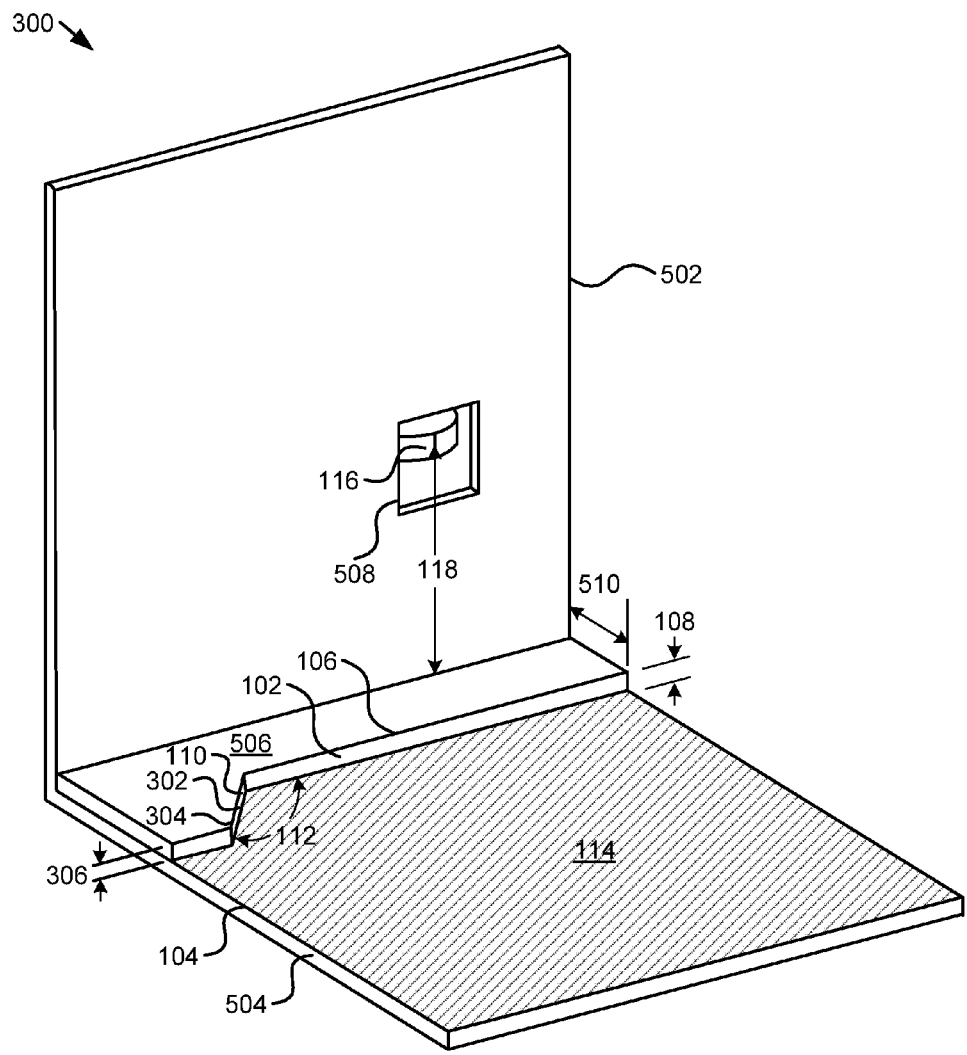
FIG. 5A is a schematic block diagram illustrating a first perspective view of a third embodiment of a testing apparatus in accordance with the present invention.
Figure 5B:
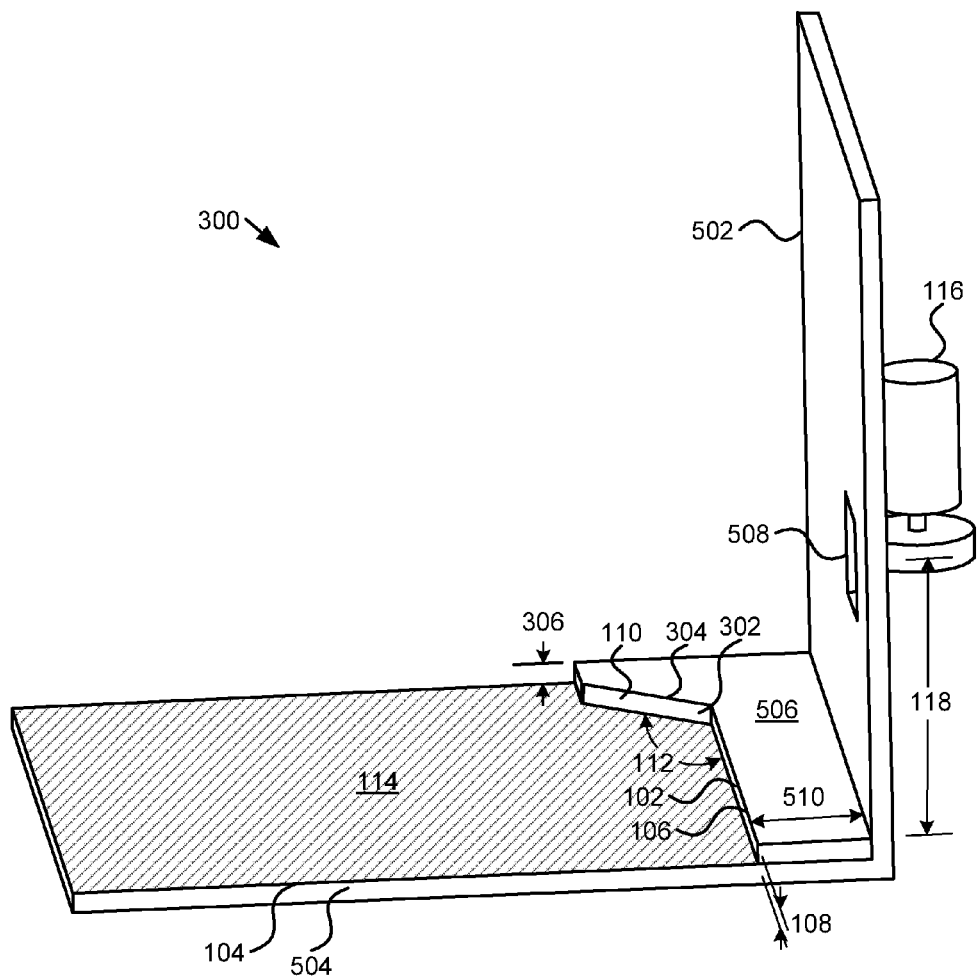
FIG. 5B is a schematic block diagram illustrating a second perspective view of the third embodiment of a testing apparatus in accordance with the present invention.
Figure 6A:
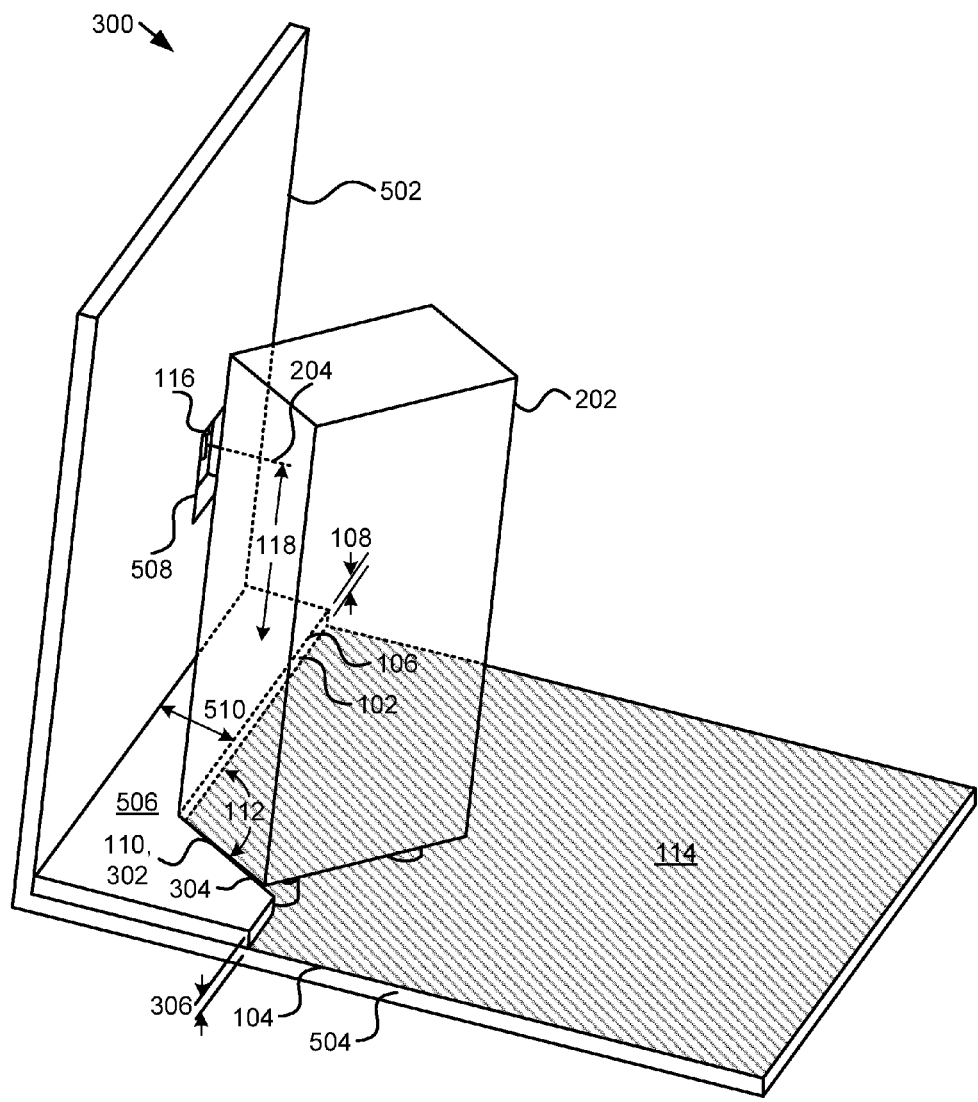
FIG. 6A is a schematic block diagram illustrating a first perspective view of the third embodiment of a testing apparatus with a wheeled assembly in the first position in accordance with the present invention.
Figure 6B:
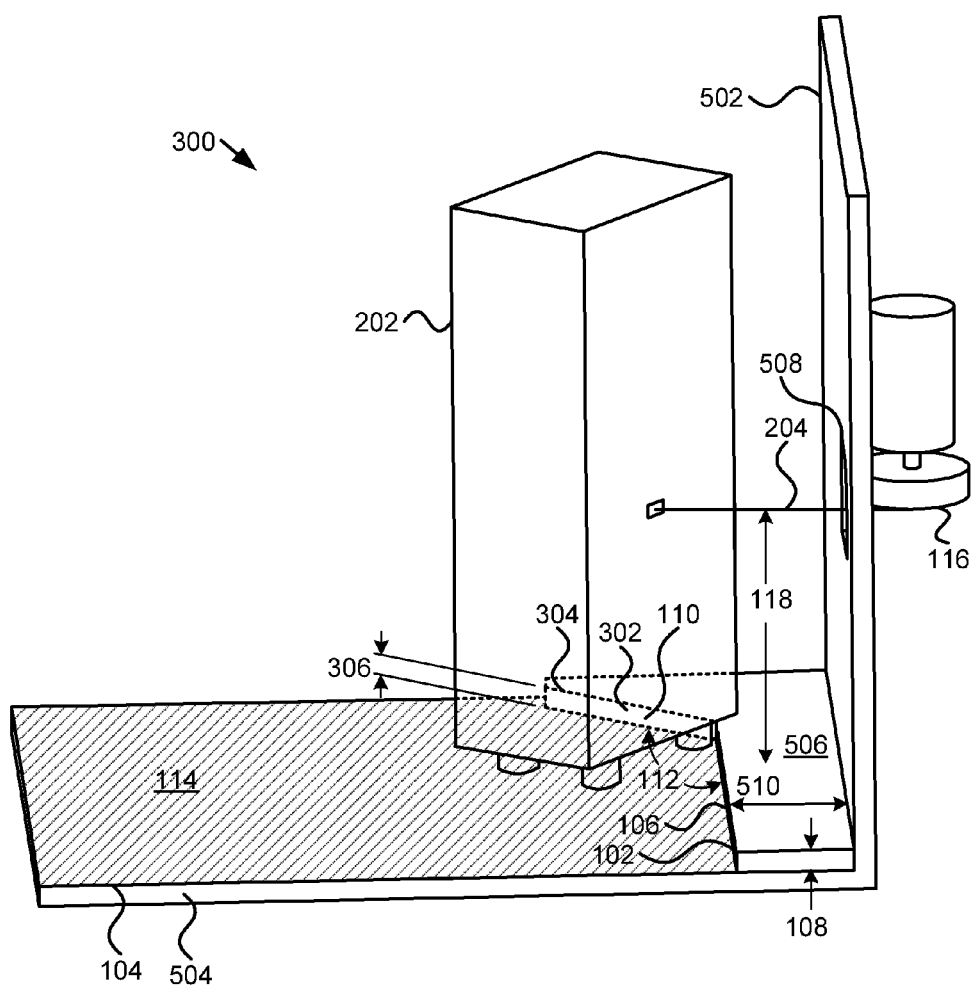
FIG. 6B is a schematic block diagram illustrating a second perspective view of the third embodiment of a testing apparatus with a wheeled assembly in the first position in accordance with the present invention.
Figure 6C:
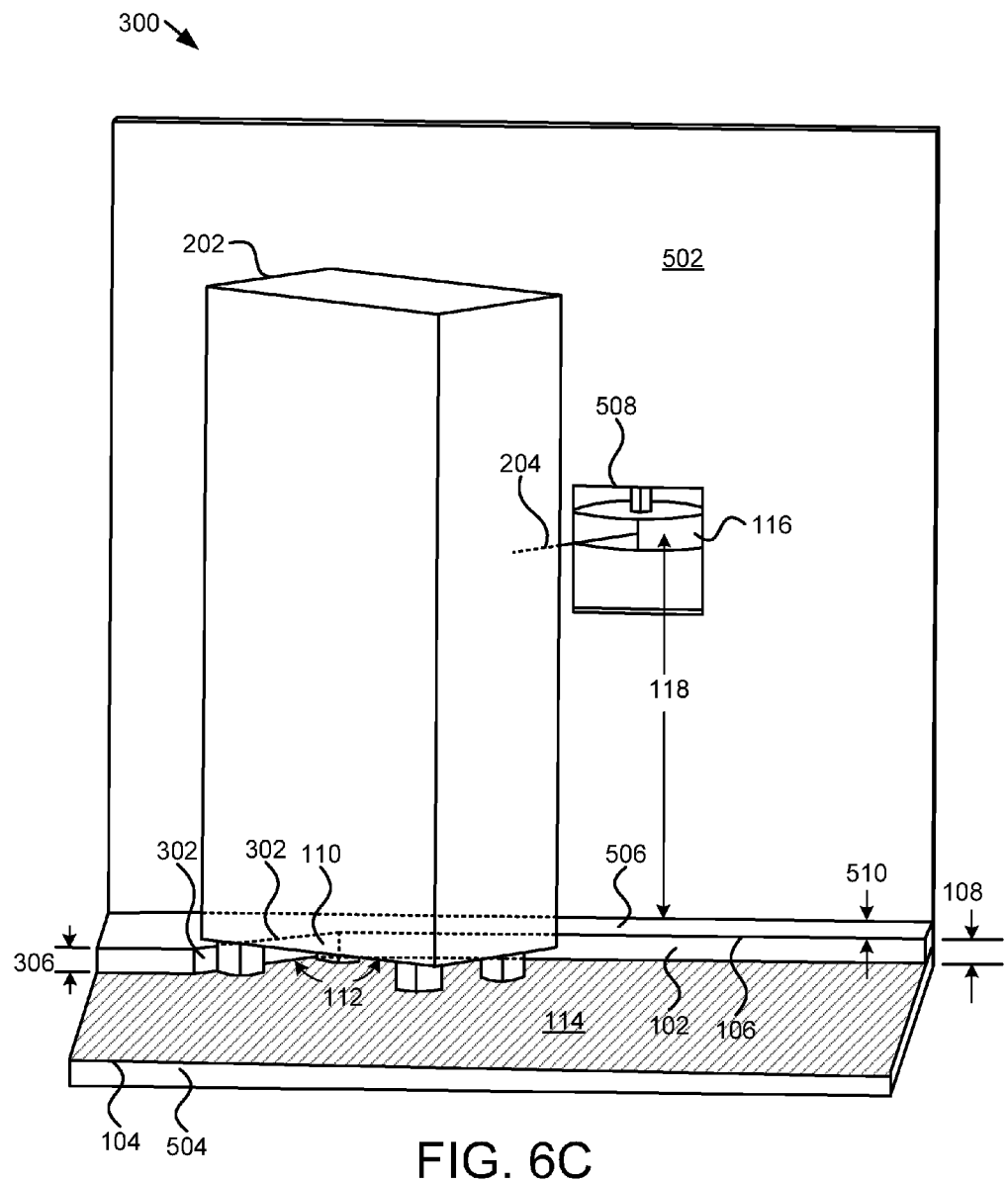
FIG. 6C is a schematic block diagram illustrating a third perspective view of the third embodiment of a testing apparatus with a wheeled assembly in the first position in accordance with the present invention.

FIGS. 5A, and 5B are schematic block diagrams illustrating a first and a second perspective view of a third embodiment of a testing apparatus 300 in accordance with the present invention. FIGS. 6A, 6B, and 6C are schematic block diagrams illustrating a first, a second, and a third perspective view of the third embodiment of a testing apparatus 300 with a wheeled assembly 202 in accordance with the present invention. The testing apparatus 300 includes a straight fulcrum 102, a horizontal surface 104, a straight edge 106, a first height 108, a first position mechanism 110, an angled fulcrum 302 with an angled edge 304, a second height 306, a first position angle 112, an assembly test area 114, a force mechanism 116, and a vertical offset 118 which are substantially similar to the testing apparatus 200 of the second embodiment in FIGS. 3A, 3B, 4A, 4B, 4C, and 4D. The testing apparatus 300 also includes a vertical planar element 502, a first horizontal planar element 504, a second horizontal planar element 506, an opening 508, and a horizontal offset 510, which are discussed below.

In one embodiment, the testing apparatus 300 includes a vertical planar element 502 extending perpendicular to the horizontal surface 104. The vertical planar element 502, in one example, is positioned parallel to the straight edge 106 and away from the assembly testing area 114. The vertical planar element 502, may be configured to prevent a wheeled assembly 202 from falling when the wheeled assembly 202 tips past a tipping point. The vertical planar element 502 may be sized as depicted or may be a different height and/or width.

The vertical planar element 502, in various embodiments, may be angled with respect to the horizontal surface 104 and/or the straight edge 106. In one embodiment, the vertical planar element 502 includes multiple parts of various sizes and positions (not shown). For example, a portion of the vertical planar element 502 may be parallel to the straight edge 106 while another portion of the vertical planar element 502 may be parallel to the angled edge 304. In another embodiment, the testing apparatus 300 may include multiple vertical planar elements 502 positioned on two or more sides of the horizontal surface 104 to help prevent a wheeled assembly 202 from tipping over. One of skill in the art will recognize other configurations of a vertical planar element 502 that may aid in preventing a wheeled assembly 202 from tipping over.

In one embodiment, the testing apparatus 300 includes a first horizontal planar element 504. In one embodiment, the first horizontal planar element 504 includes a surface that forms the horizontal surface 104. The first horizontal planar element 504 is sized to accommodate a wheeled assembly 202 and may also be configured to support the wheeled assembly without further support under the first horizontal planar element 504. In one embodiment, the first horizontal planar element 504 and attached straight fulcrum 102 and possibly other attached equipment, such as a force mechanism 116, a first position mechanism 110, a vertical planar element 502, etc. may enable tilting or other movement of the testing apparatus 300 to enable various tests and testing conditions. In another embodiment, the first horizontal planar element 504 enables the testing apparatus 300 to be moved and/or stored.

In one embodiment, the testing apparatus 300 includes a second horizontal planar element 506 that is parallel to the horizontal surface 104. The second horizontal planar element 506, in one embodiment, incorporates the straight fulcrum 102, along with the straight edge 106, and the first positioning mechanism 110 configured with an angled fulcrum 302 with an angled edge 304. The straight edge 106 and angled edge 304, in one example, are sides of the second horizontal planar element 506. In a further example, the first height 108 and the second height 306 are the same and are a thickness of the second horizontal planar element 506. In various examples, the second horizontal planar element 506 may have varying heights, different angled edges 304, etc. For example, the second horizontal planar element 506 may form two or more angled edges 304 (not shown) to accommodate one or more alternate first positions.

In another embodiment, the vertical planar element 502 includes an opening 508. The opening 508 may be configured to allow the force mechanism 116 to provide a force to the wheeled assembly 202 through the opening and the force mechanism 116 may be located behind the vertical planar element 502. In another embodiment, the vertical planar element 502 includes multiple openings 508. Multiple openings 508 may allow the force mechanism 116 to be relocated or reconfigured for alternate testing schemes. In this embodiment, there is a horizontal offset 510 defined by a distance from the straight edge 106 to the vertical planar element 502, which is effectively an offset to allow movement the wheeled assembly 202 after contacting the straight edge 106 and then tilting toward the vertical planar element 502.

Figure 7:
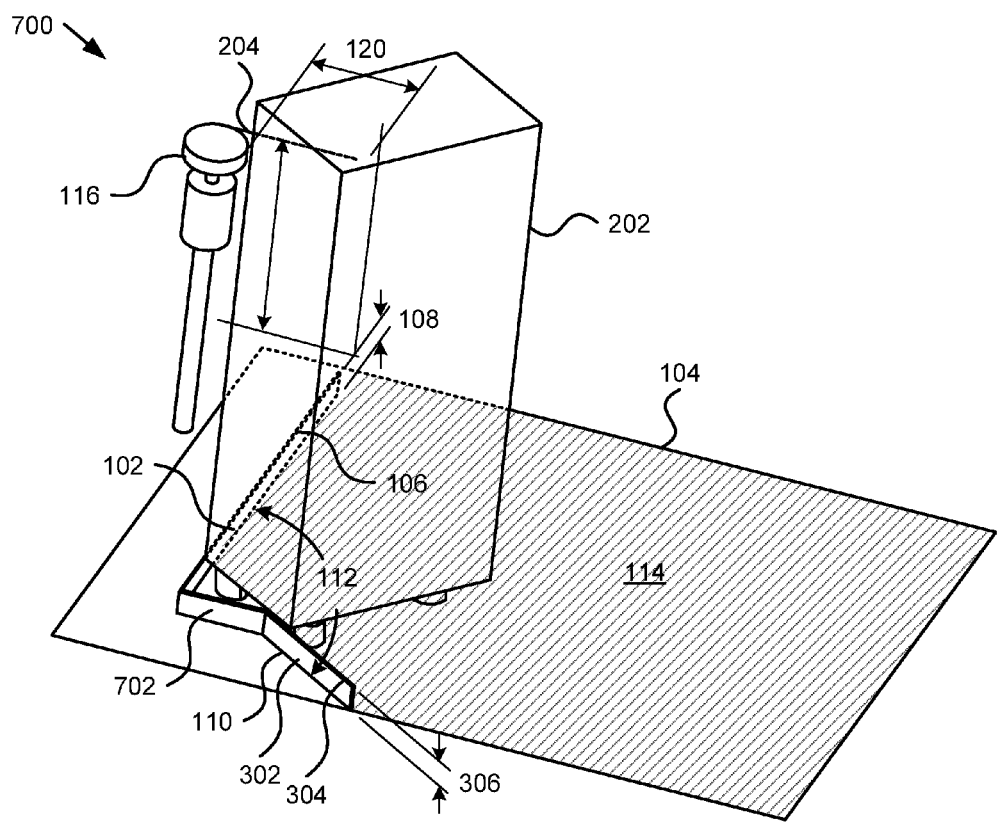
FIG. 7 is a schematic block diagram illustrating a perspective view of a fourth embodiment of a testing apparatus with a wheeled assembly in accordance with the present invention.

FIG. 7 is a schematic block diagram illustrating a perspective view of a fourth embodiment of a testing apparatus 700 with a wheeled assembly 202 in accordance with the present invention. The testing apparatus 700 may include a straight fulcrum 102, a horizontal surface 104, a straight edge 106, a first height 108, a first positioning mechanism 110 with an angled fulcrum 302 with an angled edge 304 and second height 306, a first position angle 112, assembly test area 114, a force mechanism 116, a wheeled assembly 202, and a connector 204, which are substantially similar to those described in relation to the testing apparatus 200 shown in FIGS. 3A, 3B, 4A, 4B, and 4C.

The testing apparatus 700, in one embodiment, includes an angled fulcrum recess 702 that extends, in one embodiment, from the straight edge 106 to the angled fulcrum 302. In one example, the angled fulcrum recess 702 is configured to allow a wheel of the wheeled assembly to move from a position along the first position angle 112 when the wheeled assembly 202 is in the first position to a position across the first position angle 112 and away from the assembly test area 114 during a time when the wheeled assembly 202 is moving from the first position to the second position. The angled fulcrum recess 702 allows a dynamic in testing that differs from the testing apparatus 200 with an angled fulcrum 302 extending to the straight edge 106. In one embodiment, the angled fulcrum recess 702 extends straight between the straight edge 106 and angled fulcrum 302. In other embodiments, the angled fulcrum recess 702 may include other shapes, such as a curve, a v-shaped pocket, and the like. The angled fulcrum recess 702 may be any shape that allows a portion of the wheeled assembly 202 to move across the first position angle 112 past the first position mechanism 110 and away from the assembly test area 114.

In one example, the angled fulcrum recess 702 includes a structure with a height above the horizontal surface 104, as depicted in FIG. 7. In another embodiment, the angled fulcrum recess 702 is an opening in the angled fulcrum 302 without a structure. In other words, the angled fulcrum 302 may end before reaching the straight edge 106. In such an embodiment, the first positioning mechanism 110 may include the angled fulcrum 302 and possibly a line running from the angled fulcrum 302 to the straight edge 106 to indicate a first position of the wheeled assembly 202. In another embodiment, the testing apparatus 700 includes a second horizontal planar element 506 and the angled fulcrum recess 702 is a notch in the second horizontal planar element 506. In another embodiment, the testing apparatus 700 may include a recess into horizontal surface 104 to allow a wheel of the wheeled assembly 202 to dip lower than the horizontal surface 104. The recess may allow a different dynamic in stability testing of the wheeled assembly 202. In various embodiments, the testing apparatus 700 may include other elements of one or more other testing apparatuses (e.g. 100, 300, 800), such as a vertical planar element 502, a first horizontal planar element 504, a second horizontal planar element 506, etc.

Figure 8:
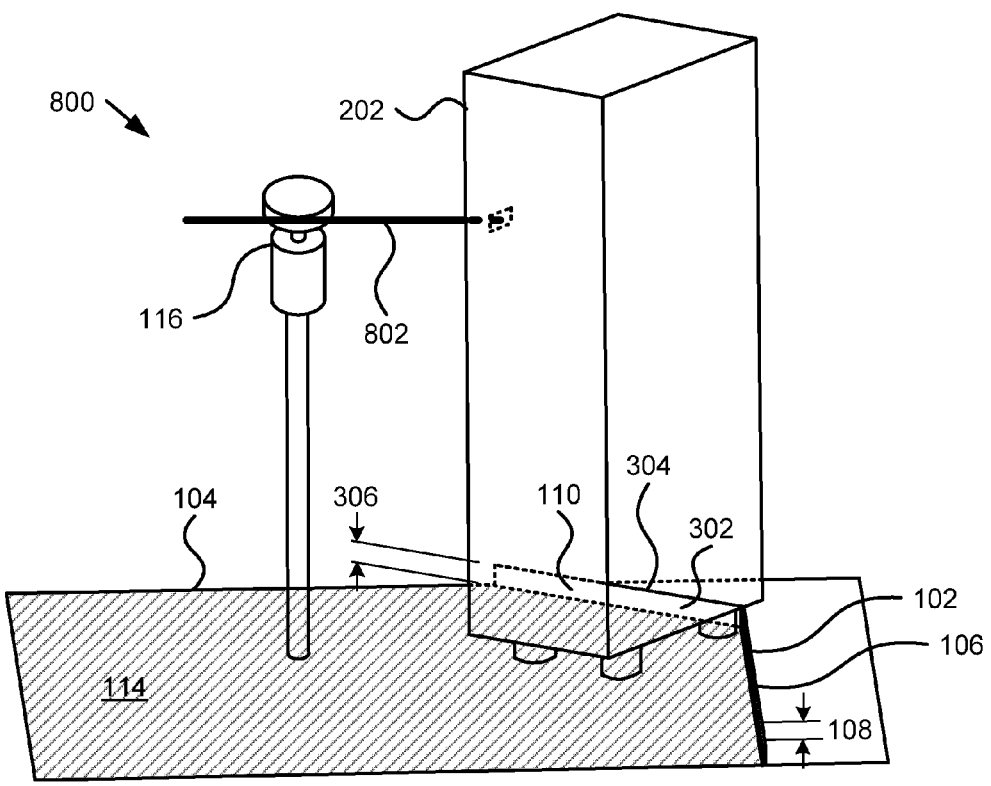
FIG. 8 is a schematic block diagram illustrating a perspective view of a fifth embodiment of a testing apparatus with a wheeled assembly in accordance with the present invention.

FIG. 8 is a schematic block diagram illustrating a perspective view of a fifth embodiment of a testing apparatus 800 with a wheeled assembly 202 in accordance with the present invention. The testing apparatus 800 may include a straight fulcrum 102, a horizontal surface 104, a straight edge 106, a first height 108, a first positioning mechanism 110 with an angled fulcrum 302 with an angled edge 304 and second height 306, a first position angle 112, assembly test area 114, a force mechanism 116, a wheeled assembly 202, and a connector 204, which are substantially similar to those described in relation to the testing apparatus 200 shown in FIGS. 3A, 3B, 4A, 4B, and 4C. The testing apparatus 800 includes a force mechanism 116 located in a position to push the wheeled assembly 202 from the first position to the second position. The testing apparatus 800 may include a connector 802 that is solid and is configured with the force mechanism 116 to push the wheeled assembly. In another embodiment, the testing apparatus 800 includes a second force mechanism 116 configured to pull the wheeled assembly 202. One of skill in the art will recognize other locations of a force mechanism 116 for applying force to the wheeled assembly 202. In various embodiments, the testing apparatus 800 may include other elements of one or more other testing apparatuses (e.g.

100, 300, 700), such as a vertical planar element 502, a first horizontal planar element 504, a second horizontal planar element 506, an angled fulcrum recess 702, etc.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A testing apparatus for testing stability of a wheeled assembly, the wheeled assembly comprising a bottom and sides and having three or more wheels attached to the bottom, the wheels positioned to support the wheeled assembly and to allow the wheeled assembly to move when force is applied to the wheeled assembly, the testing apparatus comprising:
    a horizontal planar element fixed relative to a horizontal surface, the horizontal planar element comprising
        a straight edge parallel to the horizontal surface, the straight edge located a first height above the horizontal surface, the first height sized to stop a wheel of the wheeled assembly, the straight edge wider than two adjacent wheels of the wheeled assembly; and
        an angled edge at the first height above the horizontal surface, the angled edge along a first position angle, the angled edge and the straight edge defining the first position angle as an obtuse angle and defining an assembly test area;
    a vertical planar element fixed relative to the horizontal surface and extending vertically, the vertical planar element perpendicular to the horizontal surface, the vertical planar element parallel to the straight edge and horizontally offset a fixed distance from the straight edge and the assembly test area, the vertical element wider than the wheeled assembly and positioned along the straight edge; and
    a force mechanism vertically offset from the straight and angled edges and horizontally offset at least the fixed distance from the straight edge, the force mechanism configured to apply a force to the wheeled assembly, wherein when the wheeled assembly is positioned in the assembly test area and in a first position with at least one wheel touching the angled edge, the force mechanism pulls the wheeled assembly through the assembly test area in a direction toward a second position such that the wheeled assembly rotates on a vertical axis, the second position comprising at least one wheel of the wheeled assembly contacting the straight edge, the wheel that contacts the straight edge at the second position not being in contact with the straight edge in the first position.

2. The testing apparatus of claim 1, wherein the force mechanism is attached to the vertical planar element and applies the force to the wheeled assembly through a cable attached to the wheeled assembly.

3. The testing apparatus of claim 2, wherein the vertical offset of the force mechanism from the straight and angled edges is between three and seven feet.

4. The testing apparatus of claim 1, wherein the horizontal planar element comprises a recess, the recess positioned between the straight edge and the angled edge and extending away from the assembly test area such that a wheel of the wheeled assembly located near an intersection of the straight edge and the first position angle when the wheeled assembly is in the first position is able to cross the first position angle while the wheeled assembly moves to the second position.

5. A testing apparatus for testing stability of a wheeled assembly, the wheeled assembly comprising a bottom and sides and having three or more wheels attached to the bottom, the wheels positioned to support the wheeled assembly and to allow the wheeled assembly to move when force is applied to the wheeled assembly, the testing apparatus comprising:
    a straight fulcrum fixed relative to a horizontal surface, the straight fulcrum comprising a straight edge parallel to the horizontal surface, the straight edge located a first height above the horizontal surface, the first height sized to stop the wheeled assembly;
    a first position mechanism, the first position mechanism comprising a first position angle, the first position mechanism and the straight edge defining the first position angle as an obtuse angle and defining an assembly test area; and
    a force mechanism vertically offset from the straight edge, the force mechanism configured to apply a force to the wheeled assembly, wherein when the wheeled assembly is positioned in a first position with one side of the wheeled assembly parallel to the first position angle, the force mechanism pulls the wheeled assembly in a direction toward a second position such that the wheeled assembly rotates on a vertical axis, the second position comprising at least one portion of the wheeled assembly contacting the straight edge, the portion of the wheeled assembly contacting the straight edge at the second position not being in contact with the straight edge in the first position.

6. The testing apparatus of claim 5, wherein the first position mechanism comprises an angled fulcrum fixed relative to the horizontal surface, the angled fulcrum comprising an angled edge, the angled edge positioned along the first position angle, the angled edge at a second height above the horizontal surface, the second height sized to stop the wheeled assembly.

7. The testing apparatus of claim 6, wherein the first height is the same as the second height.

8. The testing apparatus of claim 7, wherein the straight fulcrum and the angled fulcrum comprise portions of a horizontal planar element, the horizontal planar element comprising a surface parallel to the horizontal surface and at the first height above the horizontal surface.

9. The testing apparatus of claim 6, further comprising an angled fulcrum recess that extends from the straight edge to the angled fulcrum, the angled fulcrum recess configured to allow a wheel of the wheeled assembly to move from a position along the first position angle when the wheeled assembly is in the first position to a position across the first position angle and away from the assembly test area during a time when the wheeled assembly is moving from the first position to the second position.

10. The testing apparatus of claim 9, wherein the wheel that moves across the first position angle comprises a second wheel and wherein the angled fulcrum recess extends to a location on the angled fulcrum closer to the straight edge than a first wheel of the wheeled assembly that touches the angled fulcrum when the wheeled assembly is in the first position, the first wheel that touches the angled fulcrum being positioned away from the straight edge, the second wheel located nearer an intersection of the straight edge and the first position angle than other wheels of the wheeled assembly when the wheeled assembly is in the first position.

11. The testing apparatus of claim 5, further comprising a vertical planar element fixed relative to the horizontal surface and extending vertically and perpendicular to the horizontal surface, the vertical planar element parallel to the straight edge and horizontally offset a fixed distance from the straight edge and the assembly test area.

12. The testing apparatus of claim 11, wherein the force mechanism is horizontally offset from the straight edge a distance that is equal to or greater than the distance the vertical planar element is offset from the straight edge.

13. The testing apparatus of claim 11, wherein the vertical planar element is wider than the wheeled assembly, extends vertically at least a height of the wheeled assembly, and is offset from the straight edge a distance such that the wheeled assembly can tip toward the vertical planar element and off one or more wheels after the wheeled assembly reaches the second position.

14. The testing apparatus of claim 5, wherein the force mechanism applies a constant force to the wheeled assembly for a fixed period of time.

15. The testing apparatus of claim 5, wherein the force mechanism applies the force to the wheeled assembly with a cable extending from the wheeled assembly to the force mechanism.

16. The testing apparatus of claim 5, wherein the force mechanism applies a plurality of forces to the wheeled assembly, the plurality of forces comprising a plurality of stability test conditions.

17. The testing apparatus of claim 16, wherein the force mechanism applies a first force to the wheeled assembly during a stability test and in each subsequent test applies an increased amount of force and wherein a first test condition wherein the wheeled assembly tips over defines a tipping point force.

18. The testing apparatus of claim 5, wherein the horizontal surface comprises a horizontal planar element extending under the straight fulcrum, the first position mechanism, and the assembly test area.

19. The testing apparatus of claim 5, wherein the force mechanism stops applying the force at or before at time when the wheeled assembly reaches the second position.

20. A testing apparatus for testing stability of a wheeled assembly, the wheeled assembly comprising a bottom and sides and having three or more wheels attached to the bottom, the wheels positioned to support the wheeled assembly and to allow the wheeled assembly to move when force is applied to the wheeled assembly, the wheeled assembly comprising a height that is greater than a width of the wheeled assembly, the testing apparatus comprising:
  a first horizontal planar element with a width and length greater than the wheeled assembly;
  a vertical planar element perpendicular to the first horizontal planar element, the vertical planar element attached to an edge of the first horizontal planar element, the vertical planar element with a width and a height greater than the wheeled assembly;
  a second horizontal planar element attached to one or more of the vertical planar element and to the first horizontal planar element, the second horizontal planar element comprising a top that is parallel to the first horizontal planar element, the second planar element comprising a straight edge and an angled edge,
    the straight edge running parallel to the vertical planar element and at a height from the first horizontal planar element configured to stop a wheel of the wheeled assembly, the straight edge offset horizontally from the vertical planar element a distance so that a side of the wheeled assembly does not touch the vertical planar element when at least one wheel of the wheeled assembly is touching the straight edge; and
    the angled edge and the straight edge defining a obtuse angle and an assembly test area on the first horizontal planar element, the angled edge matching a height of the straight edge; and
  a force mechanism attached to the vertical planar element and vertically offset from the second horizontal element, the force mechanism configured to apply a force to the wheeled assembly, wherein when the wheeled assembly is positioned in a first position with at least one wheel touching the angled edge, the force mechanism pulls the wheeled assembly in a direction toward a second position such that the wheeled assembly rotates on a vertical axis, the second position comprising at least one portion of the wheeled assembly contacting the straight edge, the portion of the wheeled assembly that contacts the straight edge at the second position not being in contact with the straight edge in the first position.

\* \* \* \* \*